United States Patent
Song et al.

(10) Patent No.: US 9,087,566 B2
(45) Date of Patent: Jul. 21, 2015

(54) SEMICONDUCTOR MEMORY DEVICES INCLUDING A DISCHARGE CIRCUIT

(71) Applicant: Samsung Electronics Co., Ltd., Suwon-si (KR)

(72) Inventors: Tae Joong Song, Seongnam-si (KR); Gyu Hong Kim, Seoul (KR); Jae Ho Park, Suwon-si (KR); Gi Young Yang, Seoul (KR); Jong Hoon Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 14/038,932

(22) Filed: Sep. 27, 2013

(65) Prior Publication Data

US 2014/0101395 A1 Apr. 10, 2014

(30) Foreign Application Priority Data

Oct. 5, 2012 (KR) ........................ 10-2012-0110871

(51) Int. Cl.
  *G06F 12/00* (2006.01)
  *G11C 7/12* (2006.01)
  *G11C 11/419* (2006.01)
(52) U.S. Cl.
  CPC *G11C 7/12* (2013.01); *G06F 12/00* (2013.01); *G11C 11/419* (2013.01)
(58) Field of Classification Search
  CPC .......... G11C 7/12; G11C 11/419; G06F 12/00
  USPC ...................... 711/154; 365/203, 189.05, 154
  See application file for complete search history.

(56) References Cited

U.S. PATENT DOCUMENTS

| | | | |
|---|---|---|---|
| 4,618,944 A * | 10/1986 | Okajima | 365/179 |
| 6,717,842 B2 | 4/2004 | Watanabe et al. | |
| 6,934,182 B2 | 8/2005 | Chan et al. | |
| 7,885,124 B2 | 2/2011 | Koike et al. | |
| 7,983,073 B2 | 7/2011 | Wang | |
| 2002/0114188 A1 * | 8/2002 | Lee | 365/185.18 |
| 2008/0294838 A1 * | 11/2008 | Houston et al. | 711/103 |
| 2012/0014172 A1 | 1/2012 | Jung et al. | |
| 2012/0320691 A1 * | 12/2012 | Dally et al. | 365/189.15 |

FOREIGN PATENT DOCUMENTS

| | | |
|---|---|---|
| JP | 2003-288788 | 10/2003 |
| JP | 2007-004888 | 1/2007 |
| JP | 2007-164888 | 6/2007 |
| JP | 2009-158073 | 7/2009 |
| KR | 10-2009-0096122 A | 9/2009 |

* cited by examiner

*Primary Examiner* — Eric Oberly
(74) *Attorney, Agent, or Firm* — Myers Bigel Sibley & Sajovec, PA

(57) ABSTRACT

Semiconductor memory devices are provided. Each of the semiconductor memory devices may include first and second memory cells. The first memory cell may be connected to a bit line and a complementary bit line. Moreover, each of the semiconductor memory devices may include a discharge circuit connected to the first memory cell via the bit line and the complementary bit line. The discharge circuit may be configured to discharge the first memory cell during a read or write operation of the second memory cell.

20 Claims, 14 Drawing Sheets

SEMICONDUCTOR MEMORY DEVICES INCLUDING A DISCHARGE CIRCUIT

CROSS-REFERENCE TO RELATED APPLICATION

This U.S. non-provisional patent application claims priority under 35 U.S.C. §119 to Korean Patent Application No. 10-2012-0110871, filed on Oct. 5, 2012, in the Korean Intellectual Property Office, the disclosure of which is hereby incorporated herein by reference in its entirety.

BACKGROUND

The present disclosure relates to semiconductor memory devices. Semiconductor memory devices may be classified as static random access memory (SRAM) devices, which may store data using latches, or dynamic random access memory (DRAM) devices, which may store data using capacitors, according to a data memory method. SRAM devices may have a low integration degree and thus a low memory capacity compared with DRAM devices, but may have a simple peripheral circuit construction and may operate at high speeds. Thus, SRAM devices may be mainly used as a cache memory of a controller.

To improve operating characteristics of memory cells of SRAM devices, a method of controlling voltages (e.g., a power supply voltage, a bit line voltage, and a word line voltage) may be used. When a voltage of a word line is boosted to improve write operation characteristics of a selected memory cell, however, read operation characteristics of a half-selected memory cell corresponding to the word line may decrease.

SUMMARY

Various embodiments of the present inventive concepts provide a semiconductor memory device. The semiconductor memory device may include a plurality of memory cells in a region in which pairs of bit lines intersect with pairs of word lines. The semiconductor memory device may include a discharge circuit connected to ones of the memory cells corresponding to one of the pairs of bit lines via the one of the pairs of bit lines. Moreover, the discharge circuit may be configured to discharge a bit line or a complementary bit line, of the one of the pairs of bit lines, corresponding to a half-selected memory cell among the ones of the memory cells during a read or write operation of a memory cell selected from among the plurality of memory cells.

In various embodiments, the discharge circuit may include a connector, a dummy memory cell, and a bit line clamp circuit. The connector may be configured to connect the bit line and the complementary bit line corresponding to the half-selected memory cell to the discharge circuit in response to a selection signal. The dummy memory cell may be connected between a dummy word line and the bit line and the complementary bit line, where the dummy memory cell may be configured to discharge the bit line and the complementary bit line. The bit line clamp circuit may be configured to control a difference between respective voltages of the bit line and the complementary bit line, based on respective levels of data stored in a first latch node and a second latch node of the half-selected memory cell. In some embodiments, the dummy memory cell may include a first pass cell including a first input node, and a second pass cell including a second input node that is separated from the first input node. Moreover, in some embodiments, the dummy word line may be configured to be activated simultaneously with a word line corresponding to the selected memory cell.

According to various embodiments, the bit line and the complementary bit line corresponding to the half-selected memory cell may be configured to have different respective voltages. Moreover, in some embodiments, the semiconductor memory device may be a static random access memory (SRAM).

In various embodiments, the device may include a control circuit, and the discharge circuit may include a connector and a bit line control circuit. The connector may be configured to connect the bit line and the complementary bit line connected to the half-selected memory cell to the discharge circuit in response to a selection signal supplied from the control circuit. The bit line control circuit may be configured to pre-charge or discharge the bit line and the complementary bit line in response to a first control signal and a second control signal supplied from the control circuit. In some embodiments, the discharge circuit may include a bit line clamp circuit configured to control a difference between respective voltages of the bit line and the complementary bit line discharged by the bit line control circuit, based on respective levels of data stored in a first latch node and a second latch node of the half-selected memory cell. Moreover, in some embodiments, the first control signal may be a pre-charge signal output from the control circuit to pre-charge the bit line and the complementary bit line.

A memory system, according to various embodiments, may include a nonvolatile memory device and a memory controller. The memory controller may be configured to control an operation of the nonvolatile memory device, and may include a semiconductor memory device described above and a microprocessor configured to control an operation of the semiconductor memory device. In some embodiments, a multi-chip package may include the memory system.

A memory system, according to various embodiments, may include a display unit, a nonvolatile memory device, and a memory controller. The memory controller may be configured to transmit data output from the nonvolatile memory device to the display unit, and may include a semiconductor memory device described above.

A system on chip (SoC), according to various embodiments, may include a central processing unit (CPU), a memory controller, and a semiconductor memory device (described above). The memory controller may be configured to access an external memory to read data from or write data to the external memory, under control of the CPU. Moreover, the semiconductor memory device may be configured to store data to be read or written, under control of the CPU.

A semiconductor memory device, according to various embodiments, may include first and second memory cells, where the first memory cell may be connected to a bit line and a complementary bit line. Moreover, the semiconductor memory device may include a discharge circuit connected to the first memory cell via the bit line and the complementary bit line. The discharge circuit may be configured to discharge the first memory cell during a read or write operation of the second memory cell, and the first and second memory cells may be half-selected and selected memory cells, respectively, during the read or write operation of the second memory cell.

In various embodiments, the bit line and the complementary bit line may include a first bit line and a first complementary bit line, respectively. The semiconductor memory device may include a second bit line and a second complementary bit line connected to the second memory cell. The discharge circuit may include a first discharge circuit. The semiconductor memory device may include a second discharge circuit connected to the second memory cell via the second bit line and the second complementary bit line. Moreover, the second discharge circuit may be configured to discharge the second memory cell during a read or write operation of the first memory cell.

According to various embodiments, the first and second discharge circuits may include first and second dummy memory cells, respectively, configured to discharge a first bit line pair (including the first bit line and the first complementary bit line) and a second bit line pair (including the second bit line and the second complementary bit line), respectively. The first dummy memory cell may include first and second pass cells connected to the first bit line and the first complementary bit line, respectively. Moreover, the first discharge circuit may include a bit line clamp circuit including first and second transistors configured to control a difference between respective voltages of the first bit line and the first complementary bit line.

A semiconductor memory device, according the various embodiments, may include first and second memory cells and first and second discharge circuits. The first and second memory cells may be connected to a first bit line pair (including a first bit line and a first complementary bit line) and a second bit line pair (including a second bit line and a second complementary bit line), respectively. The first and second discharge circuits may be connected to the first and second memory cells via the first and second bit line pairs, respectively. The first discharge circuit may be configured to discharge the first memory cell during a read or write operation of the second memory cell, and the first and second memory cells may be half-selected and selected memory cells, respectively, during the read or write operation of the second memory cell. Moreover, the second discharge circuit may be configured to discharge the second memory cell during a read or write operation of the first memory cell, and the first and second memory cells may be selected and half-selected memory cells, respectively, during the read or write operation of the first memory cell.

In various embodiments, the first and second discharge circuits may be first and second dummy memory cells, respectively, that are configured to discharge the first and second bit line pairs, respectively. The first dummy memory cell may include first and second pass cells connected to the first bit line and the first complementary bit line, respectively. Moreover, the first discharge circuit may include a bit line clamp circuit including first and second transistors configured to control a difference between respective voltages of the first bit line and the first complementary bit line.

BRIEF DESCRIPTION OF THE DRAWINGS

The above and other features and advantages of the disclosure will become more apparent in view of the attached drawings and accompanying detailed description.

DETAILED DESCRIPTION

Figure 1:
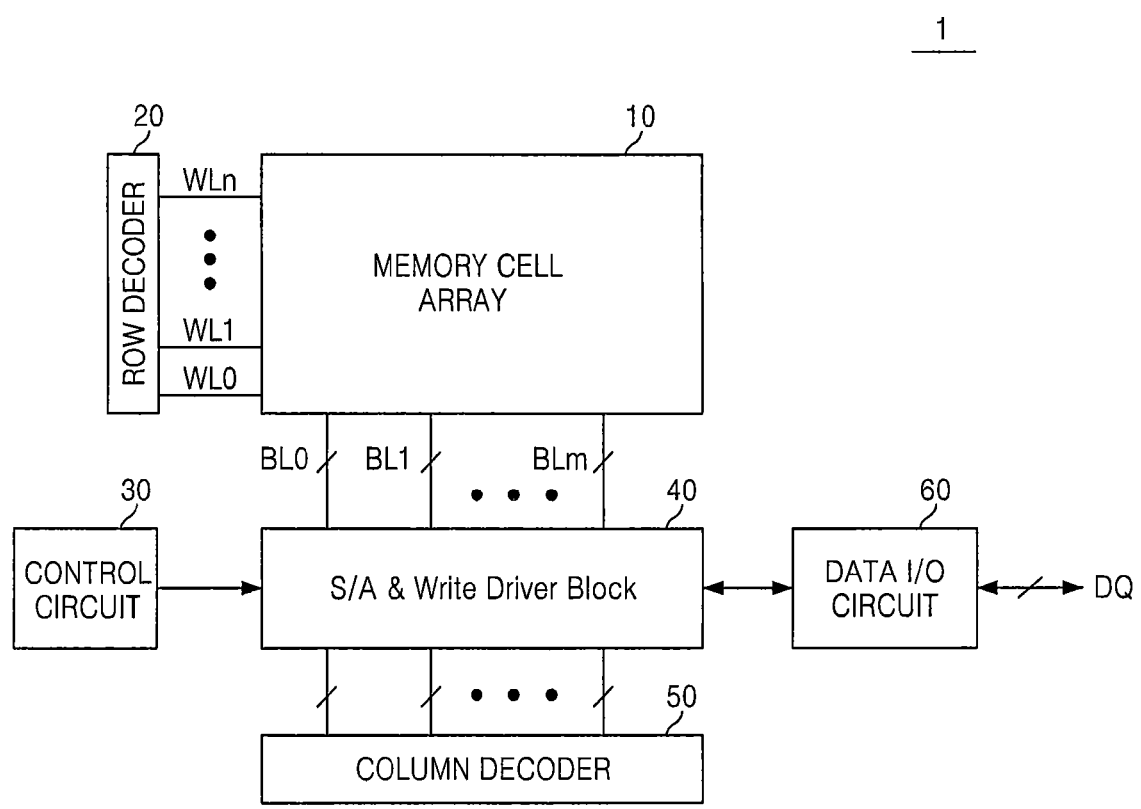
FIG. 1 is a block diagram of a semiconductor memory device according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly, Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram of a semiconductor memory device 1 according to some embodiments. Referring to FIG. 1, the semiconductor memory device 1 may include a memory cell array 10, a row decoder 20, a control circuit 30, a sense amplifier (S/A) & write driver block 40, a column decoder 50, and a data input/output (I/O) circuit 60. Example operations of the semiconductor memory device 1 are described herein, The memory cell array 10 may include a plurality of word lines WL0 to WLn, a plurality of bit lines BL0 to BLm, and a plurality of memory cells for storing data. As used herein, 'n' and 'm' each denote a natural number. The plurality of bit lines BL0 to BLm may each include a bit line and a complementary bit line.

The row decoder 20 may decode a row address, and may selectively drive one of the plurality of word lines WL0 to WLn based on a result of decoding the row address. The control circuit 30 may control an operation of the sense amplifier & write driver block 40 based on a control signal input from a source external to the semiconductor memory device 1.

The sense amplifier & write driver block 40 may function as a write driver that writes data input via the data I/O circuit 60 to the memory cell array 10 during a write operation. The sense amplifier & write driver block 40 may also function as a sense amplifier that senses and amplifies data output from the memory cell array 10 and transmits the amplified data to the data I/O circuit 60 during a read operation. To this end, the sense amplifier & write driver block 40 may include a plurality of sense amplifiers to sense and amplify a plurality of units/pieces of data corresponding to the plurality of bit lines BL0 to BLm, respectively. In particular, the plurality of sense amplifiers may sense and amplify the plurality of units/pieces of the data corresponding to the plurality of bit lines BL0 to BLm according to a control signal output from the control circuit 30, respectively.

The column decoder 50 may decode a column address and generate a plurality of column selection signals based on a result of decoding the column address. The sense amplifier & write driver block 40 may connect the memory cell array 10 and the data I/O circuit 60 to each other, or may disconnect them from each other, according to the plurality of column selection signals.

The data I/O circuit 60 may transmit write data DQ input from a source external to the semiconductor memory device 1 to the sense amplifier & write driver block 40, or may output read data DQ sensed and amplified by the sense amplifier & write driver block 40 to a destination external to/from the semiconductor memory device 1.

Figure 2:
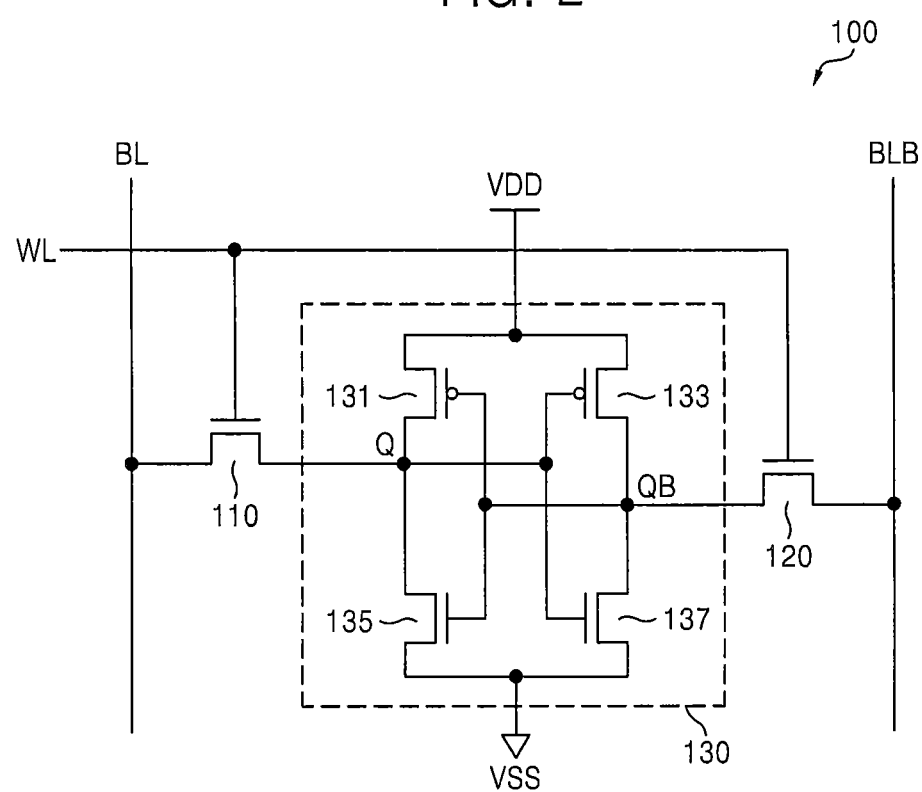
FIGS. 2 and 3 are circuit diagrams of memory cells according to some embodiments of the present inventive concepts.
Figure 3:
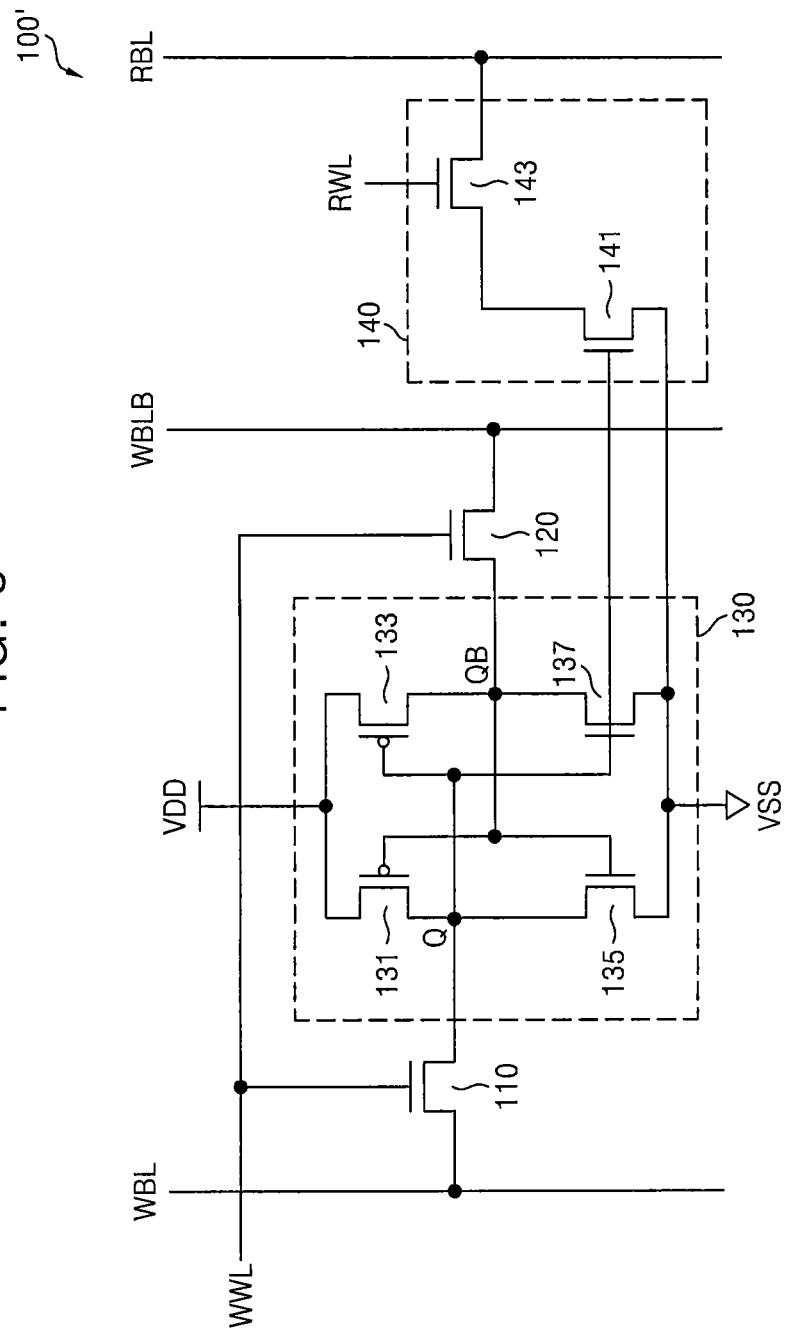

FIGS. 2 and 3 are circuit diagrams of memory cells 100 and 100' according to some embodiments. Referring to FIG. 2, the memory cell 100 may include a first pass transistor 110, a second pass transistor 120, and a latch circuit 130.

A gate and a first terminal of the first pass transistor 110 are connected to a word line WL and a bit line BL, respectively. A gate and a first terminal of the second pass transistor 120 are connected to the word line WL and a complementary bit line BLB, respectively. The latch circuit 130 is connected between the first pass transistor 110 and the second pass transistor 120, and stores data therein.

The latch circuit 130 includes a first pull-up transistor 131, a second pull-up transistor 133, a first pull-down transistor 135, and a second pull-down transistor 137. A gate and a first terminal of the first pull-up transistor 131 are connected to a second latch node QB and a power supply voltage VDD source, respectively. A gate and a first terminal of the first pull-down transistor 135 are connected to the second latch node QB and a ground voltage VSS source, respectively. The first pull-up transistor 131 and the first pull-down transistor 135 apply a power supply voltage VDD or a ground voltage VSS of the memory cell 100 to a first latch node Q, based on a signal output from the second latch node QB.

A gate and a first terminal of the second pull-up transistor 133 are connected to the first latch node Q and the power supply voltage VDD source, respectively. A gate and a first terminal of the second pull-down transistor 137 are connected to the first latch node Q and the ground voltage VSS source, respectively. The second pull-up transistor 133 and the second pull-down transistor 137 apply a power supply voltage VDD or a ground voltage VSS of the memory cell 100 to the second latch node QB, based on a signal output from the first latch node Q.

Although FIG. 2 illustrates that the memory cell 100 may be a 6-transistor (6T) memory cell including six metal oxide semiconductor (MOS) transistors, the present inventive concepts are not limited thereto, and another embodiment of the memory cell 100 is illustrated in FIG. 3. A memory cell 100' illustrated in FIG. 3 is an 8-transistor (8T) memory cell, and includes a first pass transistor 110, a second pass transistor 120, and a latch circuit 130. The memory cell 100' further includes a read buffer circuit 140. The memory cell 100' may include three bit lines (e.g., a write bit line WBL, a complementary write bit line WBLB, and a read bit line RBL) and two word lines (e.g., a write word line WWL and a read word line RWL).

The read buffer circuit 140 includes a read transistor 141 and a read driver transistor 143 that are connected in series between the read bit line RBL and a ground voltage VSS source. A gate of the read driver transistor 143 is connected to the read word line RWL, and a gate of the read transistor 141 is connected to a gate of the second pull-down transistor 137 and a first latch node Q. Thus, the read buffer circuit 140 is capable of removing read current that may be supplied from the latch circuit 130.

Although FIGS. 2 and 3 illustrate some embodiments in which a memory cell connected between the pair of bit lines BL and BLB of the memory cell array 10 of FIG. 1 includes six or eight transistors, the number of transistors included in one memory cell is not limited to six or eight.

Figure 4:
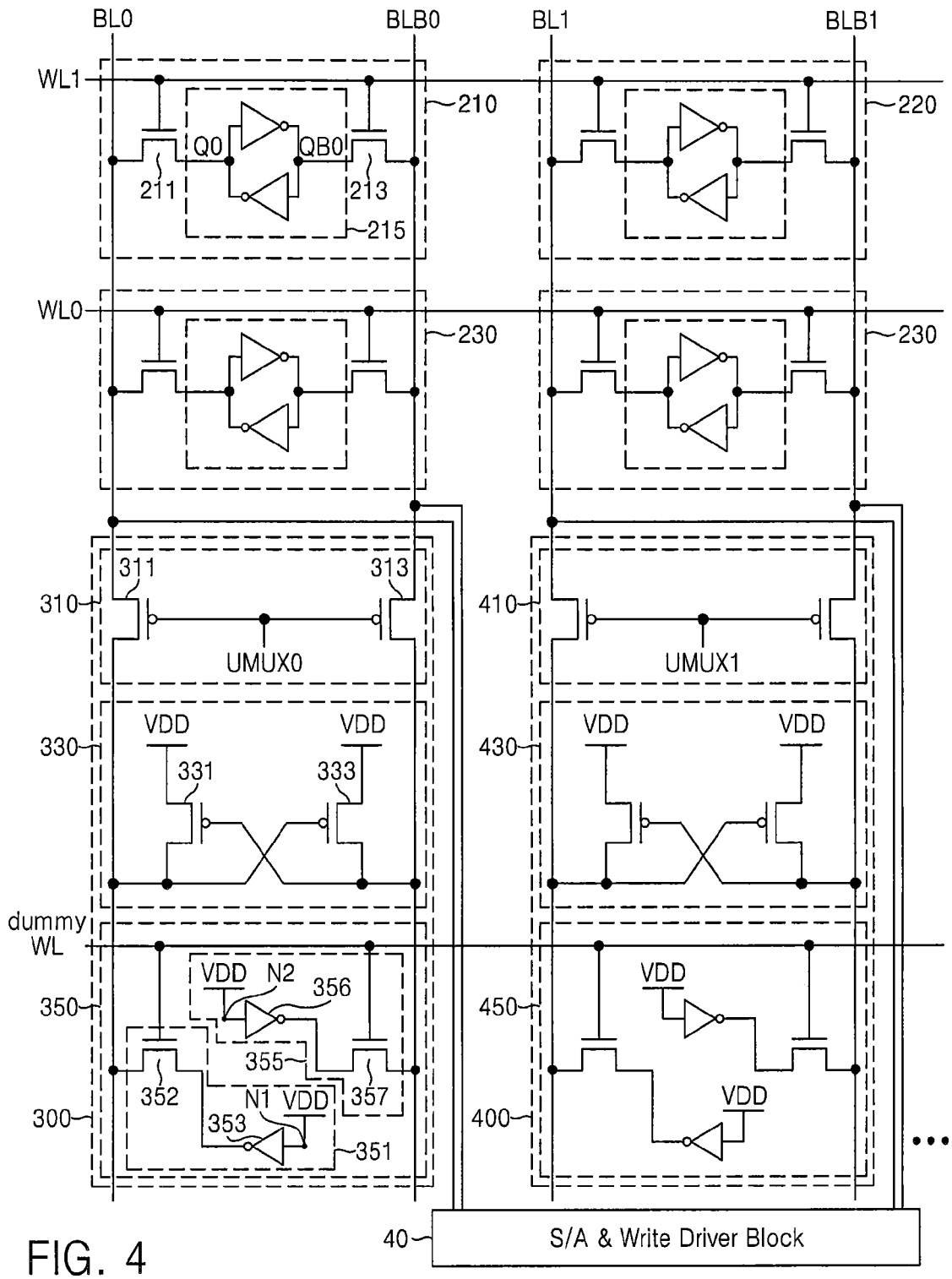
FIG. 4 is a circuit diagram of noise distribution circuits according to some embodiments of the present inventive concepts.
Figure 5:
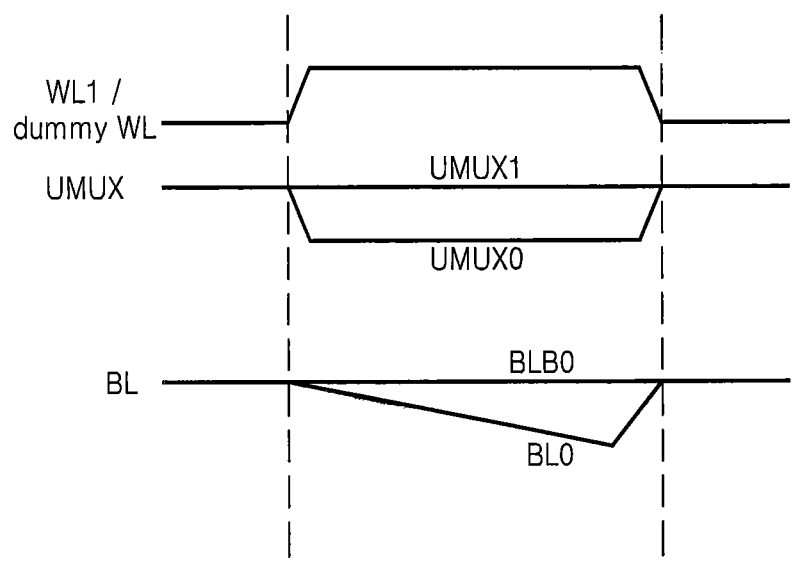
FIG. 5 is a diagram illustrating operations of the noise distribution circuits of FIG. 4.

FIG. 4 is a circuit diagram of noise distribution circuits according to some embodiments. FIG. 5 is a diagram illustrating operations of the noise distribution circuits of FIG. 4. FIG. 4 illustrates only word lines WL0 and WL1 and bit lines BL0 and BL1 among a plurality of word lines WL0 to WLn and a plurality of bit lines BL0 to BLm. Also, FIG. 4 illustrates an example in which each of the latch circuits included in a plurality of memory cells includes two inverters.

Referring to FIGS. 1 and 4, each of the plurality of memory cells of the memory cell array 10 may be configured to be connected between a bit line BL and a complementary bit line BLB included in a pair of bit lines. The memory cell array 10 may write data to or read data from a memory cell corresponding to a word line selected by the row decoder 20.

The sense amplifier & write driver block 40 may pre-charge a bit line BL and a complementary bit line BLB included in each of the plurality of bit lines BL0 to BLm, based on a pre-charge signal supplied from the control circuit 30.

For example, when a second word line WL1 selected by the row decoder 20 and a pair of second bit lines BL1 and BLB1 selected by the column decoder 50 are selected, a first memory cell 210 may be a half-selected memory cell, a second memory cell 220 may be a selected memory cell, and the other memory cells (e.g., memory cells 230) that are not selected by the row decoder 20 may be unselected memory cells.

In some embodiments, during a write/read operation performed on the second memory cell 220 selected when the second word line WL1 and the pair of second bit lines BL1 and BLB1 are enabled, a power supply voltage VDD applied to the second word line WL1 may be applied to gates of pass transistors included in half-selected memory cells connected to the second word line WL1. Accordingly, read margins of the half-selected memory cells may be reduced/lowered. For example, referring to FIGS. 4 and 6, the first memory cell 210 may be a half-selected memory cell that includes first and second pass transistors 211, 213 and a latch circuit 215.

To stably retain data stored in such half-selected memory cells, the memory cell array 10 may include noise distribution circuits corresponding to the plurality of bit lines BL0 to BLm, respectively. For convenience of explanation, an operation of a first noise distribution circuit 300 corresponding to a pair of first bit lines BL0 and BLB0 connected to the first memory cell 210 that is a half-selected memory cell is described herein as an example with reference to FIG. 4.

The first noise distribution circuit 300 includes a first connector 310, a first bit line clamp circuit 330, and a first dummy memory cell 350. The first connector 310 includes a first transistor 311 and a second transistor 313. The first connector 310 connects the first memory cell 210, which is a half-selected memory cell, to the first noise distribution circuit 300 via the first bit line BL0 and the first complementary bit line BLB0 corresponding to the first memory cell 210, according to a first selection signal UMUX0 supplied from the control circuit 30.

The first dummy memory cell 350 includes a first pass cell 351 connected between a dummy word line (dummy WL) and the first bit line BL0, and a second pass cell 355 connected between the dummy word line (dummy WL) and the first complementary bit line BLB0. The first pass cell 351 and the second pass cell 355 may be configured to include a first input node N1 and a second input node N2 that are separated from each other, respectively, so that a voltage of one of the first bit line BL0 and the first complementary bit line BLB0 may be maintained to be lower than a voltage of the other bit line according to data stored in the first memory cell 210.

In other words, the first dummy memory cell 350 may discharge the first bit line BL0 and the first complementary bit line BLB0 by receiving the power supply voltage VDD applied to the first input node N1 and the second input node N2. As such, the dummy word line (dummy WL) and the second word line WL1 corresponding to the second memory cell 220, which is a selected memory cell, may be activated simultaneously.

The first bit line clamp circuit 330 includes two transistors 331 and 33 that are cross-coupled between the first bit line BL0 and the first complementary bit line BLB0. The first bit line clamp circuit 330 may control the difference between voltages of the first bit line BL0 and the first complementary bit line BLB0 that are discharged by the first dummy memory cell 350, based on levels of data stored in first and second latch nodes Q0 and QB0 of the first memory cell 210.

An operation of the first noise distribution circuit 300 is described herein in more detail with reference to FIGS. 4 and 5 as an example. When, for example, data of logic '0' and data of logic '1' are stored in the first latch node Q0 and the second latch node QB0, respectively, and the first bit line BL0 and the first complementary bit line BLB0 are pre-charged, the data of logic '0' stored in the first latch node Q0 may be influenced by noise caused by the first bit line BL0 pre-charged to the power supply voltage VDD.

To this end, the first noise distribution circuit 300 is activated according to the first selection signal UMUX0 that is in a logic 'low' state and supplied from the control circuit 30, and a second noise distribution circuit 400 is deactivated according to a second selection signal UMUX1 that is in a logic 'high' state.

In other words, because the first transistor 311 and the second transistor 313 are turned on according to the first selection signal UMUX0 that is logic low, the first memory cell 210 is connected to the first noise distribution circuit 300 via the first bit line BL0 and the first complementary bit line BLB0.

In this case, a third transistor 352 and a fourth transistor 357 that are respectively included in the first pass cell 351 and the second pass cell 355 of the first dummy memory cell 350 are turned on by the dummy word line (dummy WL) activated simultaneously with the second word line WL1.

Then, a first inverter 353 and a second inverter 356 invert and output a power supply voltage VDD applied to the first input node N1 and the second input node N2, and the third transistor 352 and the fourth transistor 357 discharge the first bit line BL0 and the first complementary bit line BLB0 using the inverted power supply voltage VDD.

Among the first bit line BL0 and the first complementary bit line BLB0 that are discharged by the first dummy memory cell 350, a voltage of the first bit line BL0 according to a level of data '0' stored in the first latch node Q0 is reduced/lowered to be lower than a voltage of the first complementary bit line BLB0 according to a level of data '1' stored in the second latch node QB0.

Thus, because a voltage applied to a gate of a sixth transistor 333 included in the first bit line clamp circuit 330 is lower than a voltage applied to a gate of a fifth transistor 331, the first complementary bit line BLB0 has a voltage of '1' and the first bit line BL0 has a voltage that is lower than the voltage of the first complementary bit line BLB0.

In other words, as illustrated in FIG. 5, the first bit line BL0 and the first complementary bit line BLB0 that are pre-charged to the power supply voltage VDD may be discharged by the first dummy memory cell 350. A difference between voltages of the discharged first bit line BL0 and first complementary bit line BLB0 occurs according to a level of data stored in the first latch node Q0 and a level of data stored in the second latch node QB0, and is increased due to an operation of the first bit line clamp circuit 330. Thus, because the first bit line BL0 has a low voltage, data of '0' stored in the first latch node Q0 of the first memory cell 210 may be stably retained.

In another example, when the second word line WL1 and the pair of first bit lines BL0 and BLB0 are enabled, the second memory cell 220 becomes a half-selected memory cell, the first noise distribution circuit 300 is deactivated according to the first selection signal UMUX0 supplied from the control circuit 30, and the second noise distribution circuit 400 is activated according to the second selection signal UMUX1. In this case, the second connector 410, the second bit line clamp circuit 430, and the second dummy memory cell 450 of the second noise distribution circuit 400 may operate as described in the above example with respect to the first noise distribution circuit 300.

Although FIG. 4 illustrates an example in which the noise distribution circuits 300 and 400 are included in a portion of the memory cell array 10, the present inventive concepts are not limited thereto and the noise distribution circuits 300 and 400 may be included between the memory cell array 10 and the sense amplifier & write driver block 40 outside the memory cell array 10. The semiconductor memory device 1 according to some embodiments is capable of improving a read margin of a half-selected memory cell during a write/read operation performed on a selected memory cell. Also, when a word line boosting structure for improving a write margin of a selected memory cell is applied to the semiconductor memory device 1, a read margin of a half-selected memory cell may also be improved.

Figure 6:
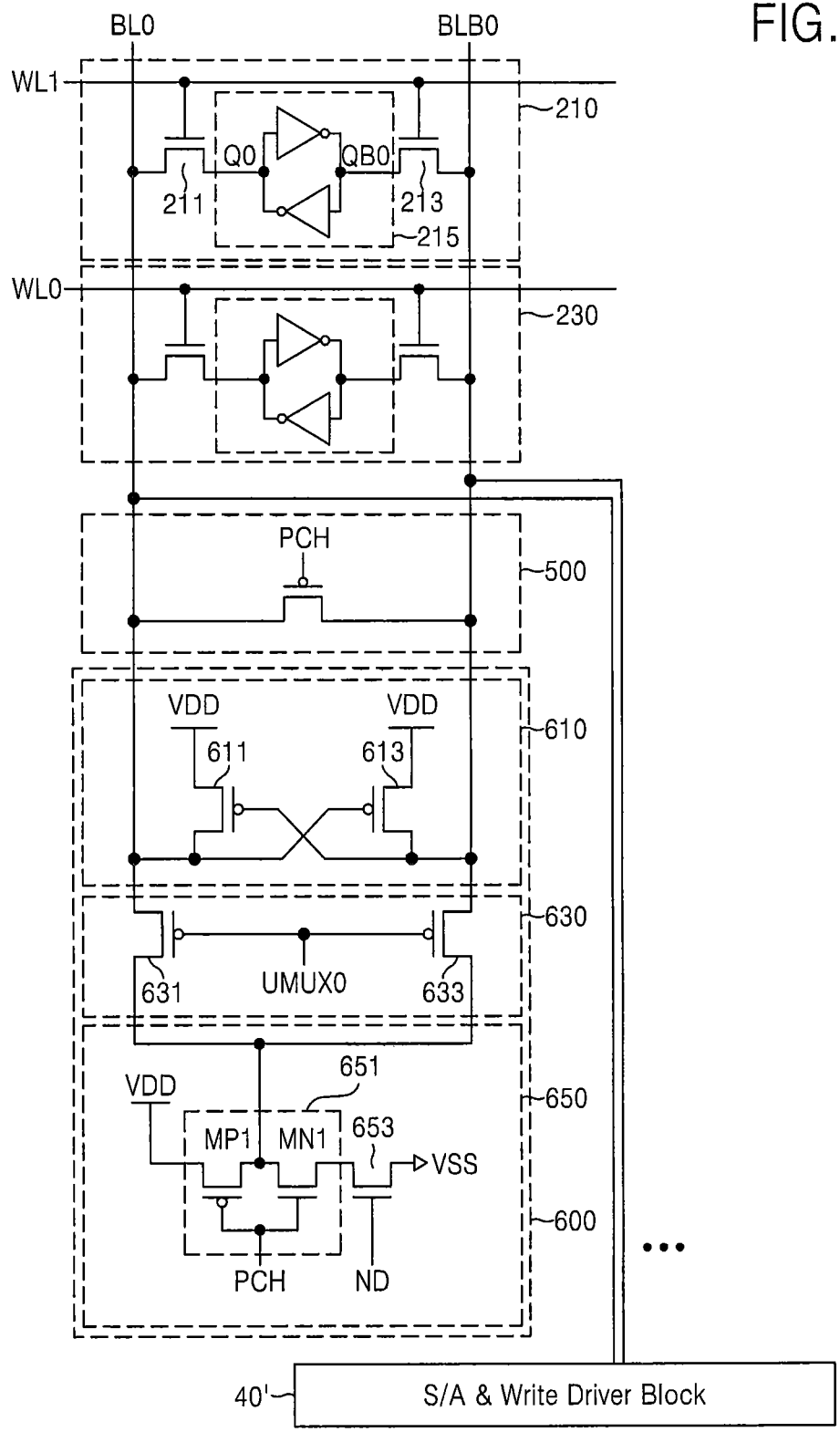
FIG. 6 is a circuit diagram of noise distribution circuits according to some embodiments of the present inventive concepts.

FIG. 6 is a circuit diagram of noise distribution circuits according to some embodiments. For convenience of explanation, FIG. 6 illustrates only memory cells 210 and 230 corresponding to a pair of bit lines BL0 and BLB0. Also, FIG. 6 illustrates an example in which the first memory cell 210 is a half-selected memory cell, as in FIG. 4.

A first noise distribution circuit 600 according to some embodiments includes a first bit line clamp circuit 610, a first connector 630, and a first bit line control circuit 650. The first connector 630 connects the first memory cell 210, which is a half-selected memory cell, to the first noise distribution circuit 600 via the first bit line BL0 and the first complementary bit line BLB0 corresponding to the first memory cell 210, according to a first selection signal UMUX0 supplied from the control circuit 30.

The first bit line control circuit 650 includes an inverting circuit 651 and a first transistor 653. The inverting circuit 651 includes a second transistor MP1 and a third transistor MN1. The first bit line control circuit 650 may pre-charge or discharge the first bit line BL0 and the first complementary bit line BLB0 according to a first control signal PCH and a second control signal ND supplied from the control circuit 30. In this case, the first bit line BL0 and the first complementary bit line BLB0 may be pre-charged by a pre-charge circuit 500 installed separately from a sense amplifier & write driver block 40' and the second transistor MP1 included in the first bit line control circuit 650.

That is, the first bit line BL0 and the first complementary bit line BLB0 may be pre-charged according to the first control signal PCH and the second control signal ND that are logic low and that are supplied to the pre-charge circuit 500 and the first bit line control circuit 650.

Also, the first bit line BL0 and the first complementary bit line BLB0 may be discharged according to the first control signal PCH and the second control signal ND that are logic high and that are supplied to the first bit line control circuit 650.

The first bit line clamp circuit 610 may control the difference between voltages of the first bit line BL0 and the first complementary bit line BLB0 discharged by the first bit line control circuit 650, based on a level of data stored in a first latch node Q0 and a level of data stored in a second latch node QB0 of the first memory cell 210.

For example, when data '0' and data '1' are stored in the first latch node Q0 and the second latch node QB0 of the first memory cell 210, respectively, the first noise distribution circuit 600 may operate such that the first bit line BL0 has a low voltage. That is, after the first bit line BL0 and the first complementary bit line BLB0 are pre-charged, a fourth transistor 631 and a fifth transistor 633 included in the first connector 630 are turned on according to that first selection signal UMUX0 that is logic low and that is supplied from the control circuit 30, thereby activating the first noise distribution circuit 600.

The first memory cell 210 is connected to the first noise distribution circuit 600 via the first bit line BL0 and the first complementary bit line BLB0. In this case, while the first bit line BL0 and the first complementary bit line BLB0 are pre-charged to a power supply voltage VDD, the third transistor MN1 and the first transistor 653 included in the inverting circuit 651 are turned on according to the first control signal PCH and the second control signal ND that are logic high signals supplied from the control circuit 30, respectively. Then, the third transistor MN1 and the first transistor 653 discharge the first bit line BL0 and the first complementary bit line BLB0 according to a ground voltage VSS.

Among the first bit line BL0 and the first complementary bit line BLB0 discharged by the first bit line control circuit 650, a voltage of the first bit line BL0 according to a level of data '0' stored in the first latch node Q0 is lower than a voltage of the first complementary bit line BLB0 according to a level of data '1' stored in the second latch node QB0.

Thus, because a voltage applied to a gate of a sixth transistor 611 included in the first bit line clamp circuit 610 is lower than a voltage applied to a gate of a seventh transistor 613, the first complementary bit line BLB0 has a voltage of '1' and the first bit line BL0 has a voltage that is lower than the voltage of the first complementary bit line BLB0. Accordingly, because the first bit line BL0 has a low voltage, data '0' stored in the first latch node Q0 of the first memory cell 210 may be stably retained.

Although FIG. 6 illustrates that the pre-charge circuit 500 and the noise distribution circuit 600 are installed between the memory cell array 10 and the sense amplifier & write driver block 40', the present inventive concepts are not limited thereto and the pre-charge circuit 500 and the noise distribution circuit 600 may be installed in a portion of the sense amplifier & write driver block 40'.

Figure 7:
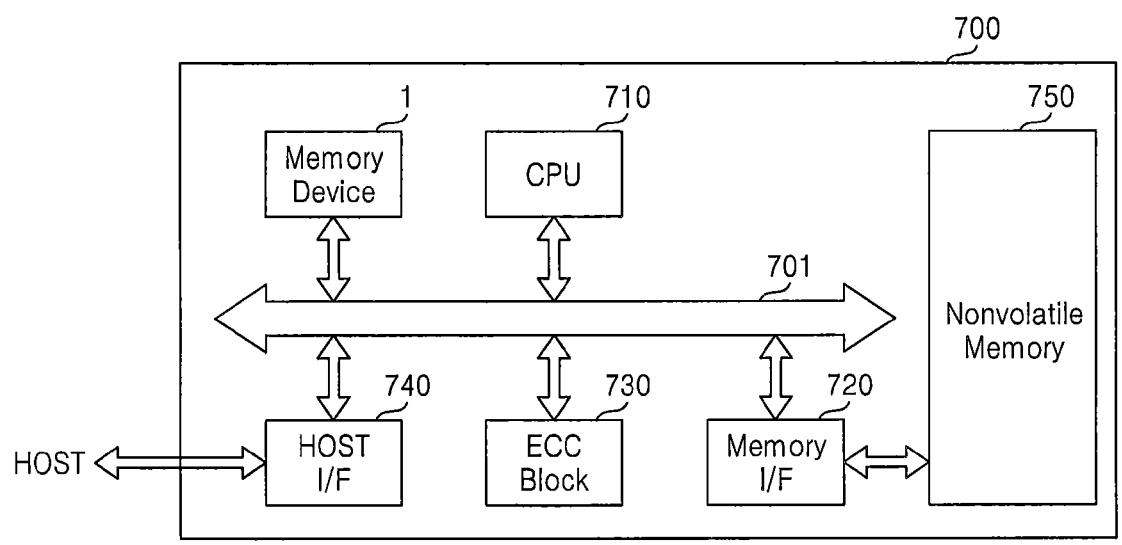
FIG. 7 is a block diagram of a memory system including the semiconductor memory device of FIG. 1 according to some embodiments of the present inventive concepts.

FIG. 7 is a block diagram of a memory system 700 including the semiconductor memory device 1 of FIG. 1 according to some embodiments. Referring to FIG. 7, the memory system 700 includes a nonvolatile memory device 750, a volatile memory device 1, and a central processing unit (CPU) 710 configured to control operations of the volatile memory device 1 and the nonvolatile memory device 750. The CPU 710 may be a microprocessor. The volatile memory device 1 may be used as an operating/operation memory of the CPU 710. The volatile memory device 1 may be embodied as a static random access memory (SRAM).

A host connected to the memory system 700 may establish data communication with the nonvolatile memory device 750 via a memory interface (I/F) 720 and a host interface (I/F) 740. An error correction code (ECC) block 730 may detect and correct an error bit included in data output from the nonvolatile memory device 750 via the memory interface 720, and transmit the error-corrected data to the host via the host interface 740, under control of the CPU 710.

The CPU 710 may control data communication among the memory interface 720, the ECC block 730, the host interface 740, and the volatile memory device 1 via a bus 701. The memory system 700 may be embodied as a flash memory drive, a universal serial bus (USB) flash memory drive, an inter-chip (IC) USB memory drive, or a memory stick.

Figure 8:
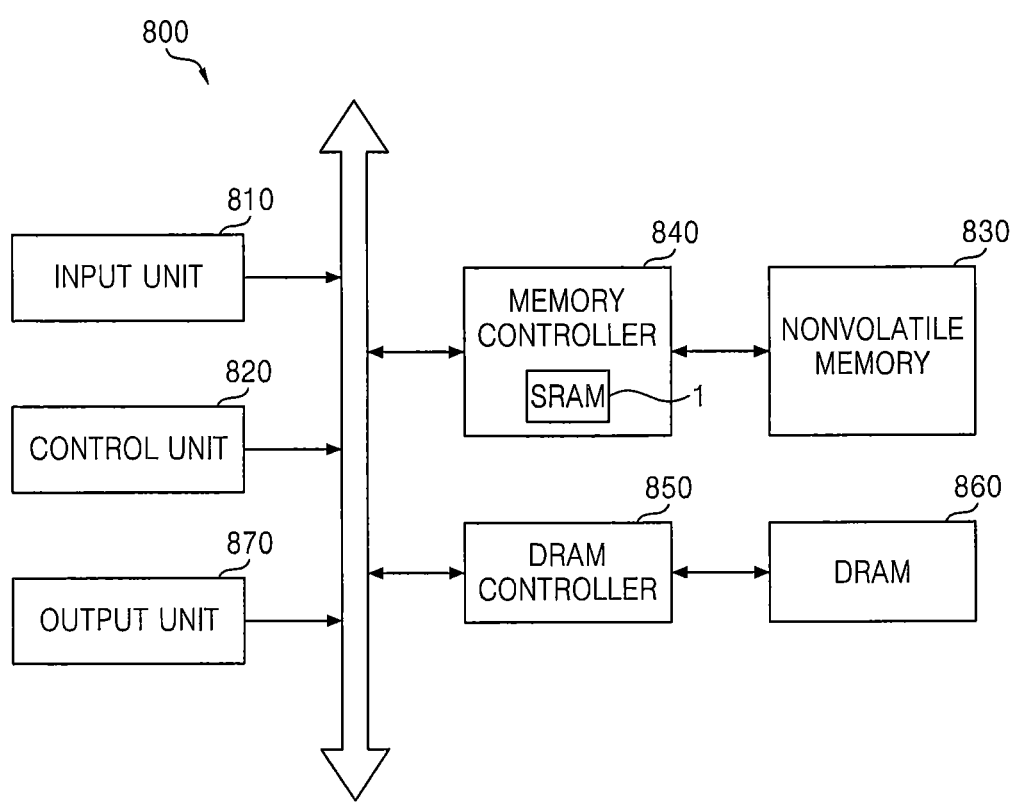
FIG. 8 is a block diagram of a memory system including the semiconductor memory device of FIG. 1 according to some embodiments of the present inventive concepts.

FIG. 8 is a block diagram of a memory system 800 including the semiconductor memory device 1 of FIG. 1 according to some embodiments. Referring to FIG. 8, the memory system 800 includes an input unit 810, a control unit 820, a nonvolatile memory device 830, a memory controller 840 including an SRAM 1, a dynamic random access memory (DRAM) controller 850, a DRAM 860, and an output unit 870.

A command is received from a source external to the memory system 800 via the input unit 810. The control unit 820 generates a control signal for performing the command received via the input unit 810. According to the control signal, data stored in the nonvolatile memory device 830 is transmitted to the memory controller 840 and is stored in the SRAM 1 included in the memory controller 840. The memory controller 840 stores the data received from the nonvolatile memory device 830 in the SRAM 1 functioning as a buffer memory, before the data is transmitted to the DRAM 860.

Because the memory system 800 includes the SRAM 1 functioning as a buffer memory, the memory system 800 may reduce/prevent a time delay from occurring when the data output from the nonvolatile memory device 830 is directly stored in the DRAM 860. The DRAM controller 850 stores the data output from the SRAM 1 in the DRAM 860. The data stored in the DRAM 860 may be output via the output unit 870 under control of the control unit 820.

Figure 9:
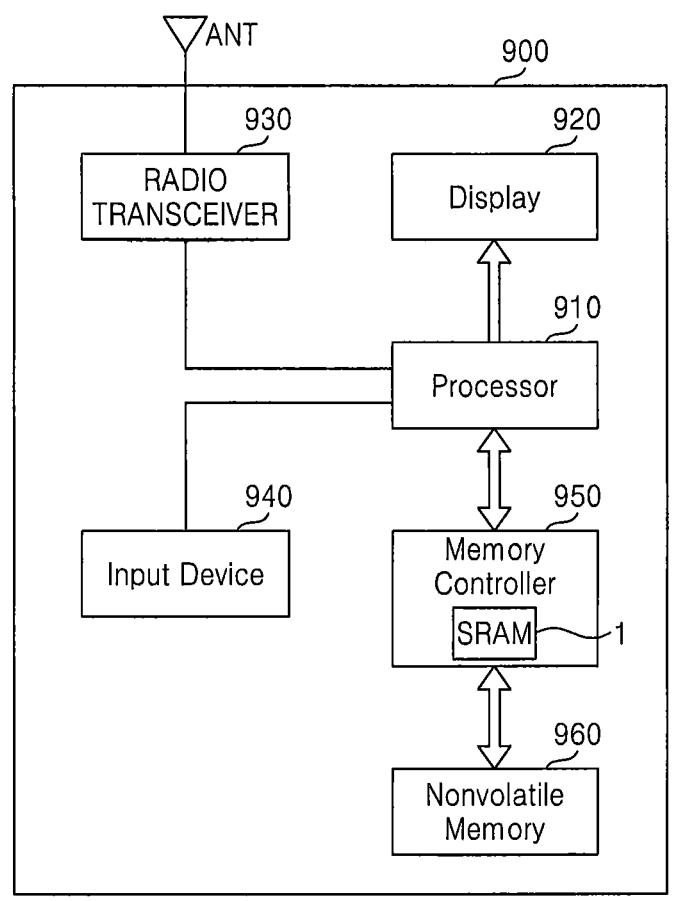
FIG. 9 is a block diagram of a memory system including the semiconductor memory device illustrated in FIG. 1 according to some embodiments of the present inventive concepts.

FIG. 9 is a block diagram of a memory system 900 including the semiconductor memory device 1 illustrated in FIG. 1 according to some embodiments. Referring to FIGS. 1 and 9, the memory system 900 may be implemented as a cellular phone, a smart phone, a tablet personal computer (PC), a personal digital assistant (PDA) or a radio communication system.

The memory system 900 includes a non-volatile memory device 960 and a memory controller 950 controlling the operations of the non-volatile memory device 960. The memory controller 950 may control data access operations, e.g., a program operation, an erase operation, and a read operation, of the non-volatile memory device 960 according to the control of a processor 910.

The memory controller 950 includes the SRAM 1 for storing data output from the nonvolatile memory device 960. The SRAM 1 may temporarily store data output from the nonvolatile memory device 960. The data stored in the SRAM 1 may be transmitted to the processor 910.

A radio transceiver 930 transmits or receives radio signals through an antenna ANT. The radio transceiver 930 may convert radio signals received through the antenna ANT into signals that can be processed by the processor 910. Accordingly, the processor 910 may process the signals output from the radio transceiver 930 and transmit the processed signals to the memory controller 950 or the display 920. The memory controller 950 may program or write the signals processed by the processor 910 to the non-volatile memory device 960. The radio transceiver 930 may also convert signals output from the processor 910 into radio signals and output the radio signals to an external device through the antenna ANT.

An input device 940 enables control signals for controlling the operation of the processor 910 or data to be processed by the processor 910 to be input to the memory system 900. The input device 940 may be implemented by a pointing device such as a touch pad or a computer mouse, a keypad, or a keyboard.

The processor 910 may control the operation of the display 920 to display data output from the memory controller 950, data received using the radio transceiver 930, or data output from the input device 940. The memory controller 950, which controls the operations of the non-volatile memory device 960, may be implemented as a part of the processor 910 or as a separate chip. The memory controller 950 and the non-volatile memory device 960 may be implemented as single package, for example, a multi-chip package.

Figure 10:
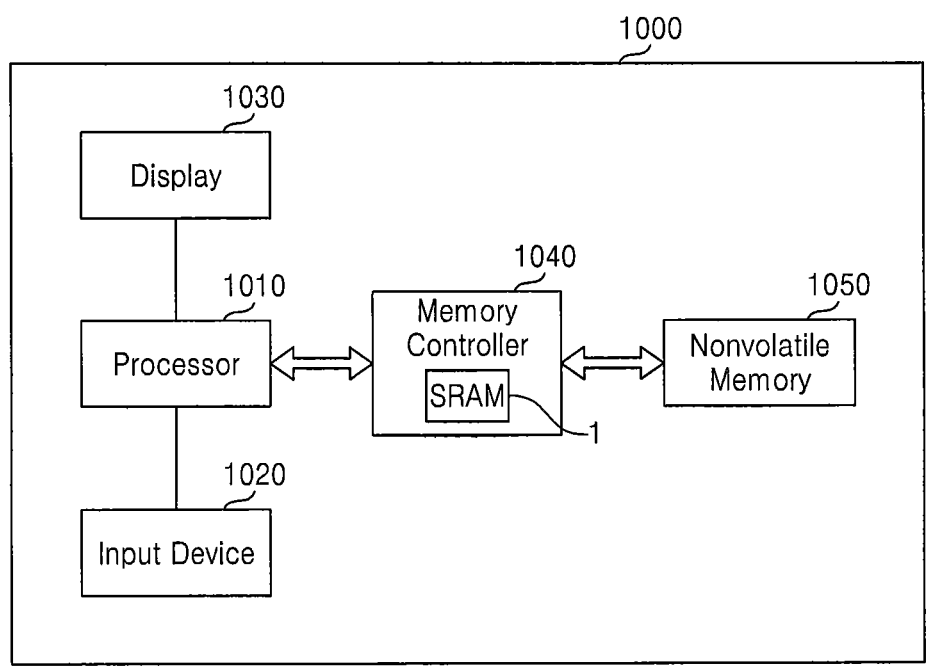
FIG. 10 is a block diagram of a memory system including the semiconductor memory device illustrated in FIG. 1 according to some embodiments of the present inventive concepts.

FIG. 10 is a block diagram of a memory system 1000 including the semiconductor memory device 1 illustrated in FIG. 1 according to some embodiments. The memory system 1000 may be implemented as a personal computer (PC), a tablet PC, a netbook, an e-reader, a personal digital assistant (PDA), a portable multimedia player (PMP), an MP3 player, or an MP4 player.

The memory system 1000 includes a non-volatile memory device 1050 and a memory controller 1040 controlling the data processing operations of the non-volatile memory device 1050. The memory controller 1040 includes the SRAM 1. The memory controller 1040 may temporarily store data output from the nonvolatile memory device 1050 in the SRAM 1. The data stored in the SRAM 1 may be transmitted to a processor 1010.

The processor 1010 may display data stored in the non-volatile memory device 1050 through a display 1030 according to data input through an input device 1020. The input device 1020 may be implemented by a pointing device such as a touch pad or a computer mouse, a keypad, or a keyboard.

The processor 1010 may control the overall operation of the memory system 1000 and the operations of the memory controller 1040. The memory controller 1040, which may control the operations of the non-volatile memory device 1050, may be implemented as a part of the processor 1010 or as a separate chip. The memory controller 1040 and the non-volatile memory device 1050 may be implemented as single package, for example, a multi-chip package.

Figure 11:
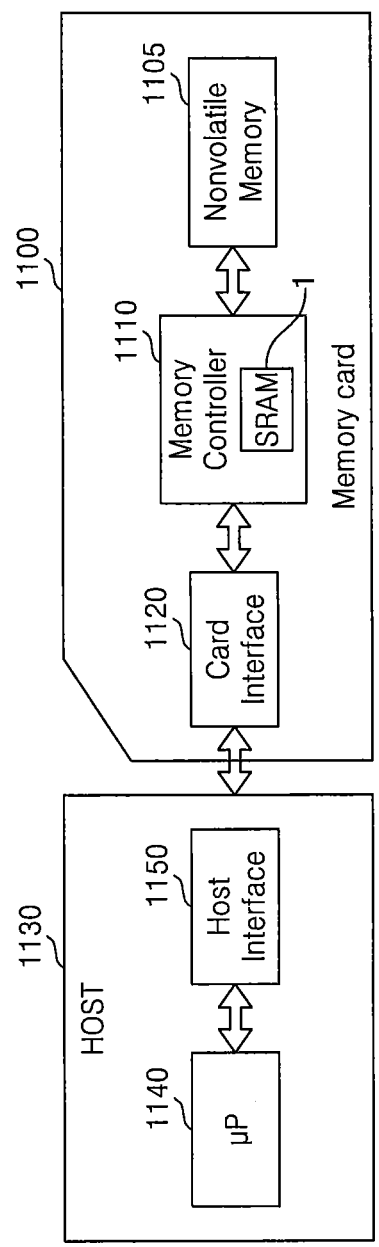
FIG. 11 is a block diagram of a memory system including the semiconductor memory device illustrated in FIG. 1 according to some embodiments of the present inventive concepts.

FIG. 11 is a block diagram of a memory system 1100 including the semiconductor memory device 1 illustrated in FIG. 1 according to some embodiments. The memory system 1100 may be implemented as a memory card or a smart card. The memory system 1100 includes a non-volatile memory device 1105, a memory controller 1110, and a card interface 1120.

The memory controller 1110 may control data exchange between the non-volatile memory device 1105 and the card interface 1120. The card interface 1120 may be a secure digital (SD) card interface or a multi-media card (MMC) interface, but the present inventive concepts are not restricted thereto.

The card interface 1120 may interface a host 1130 and the memory controller 1110 for data exchange according to a protocol of the host 1130. The memory controller 1110 may temporarily store data output from the nonvolatile memory device 1105 in the SRAM 1 included in the memory controller 1110. The data stored in the SRAM 1 may be transmitted to the card interface 1120.

The card interface 1120 may support a universal serial bus (USB) protocol and an interchip (IC)-USB protocol. Here, the card interface 1120 may indicate a hardware supporting a protocol used by the host 1130, software installed in the hardware, or a signal transmission mode.

When the memory system 1100 is connected with the host 1130 such as a PC, a tablet PC, a digital camera, a digital audio player, a cellular phone, a console video game hardware, or a digital set-top box, a host interface 1150 of the host 1130 may perform data communication with the non-volatile memory device 1105 through the card interface 1120 and the memory controller 1110 according to the control of a microprocessor (μP) 1140.

Figure 12:
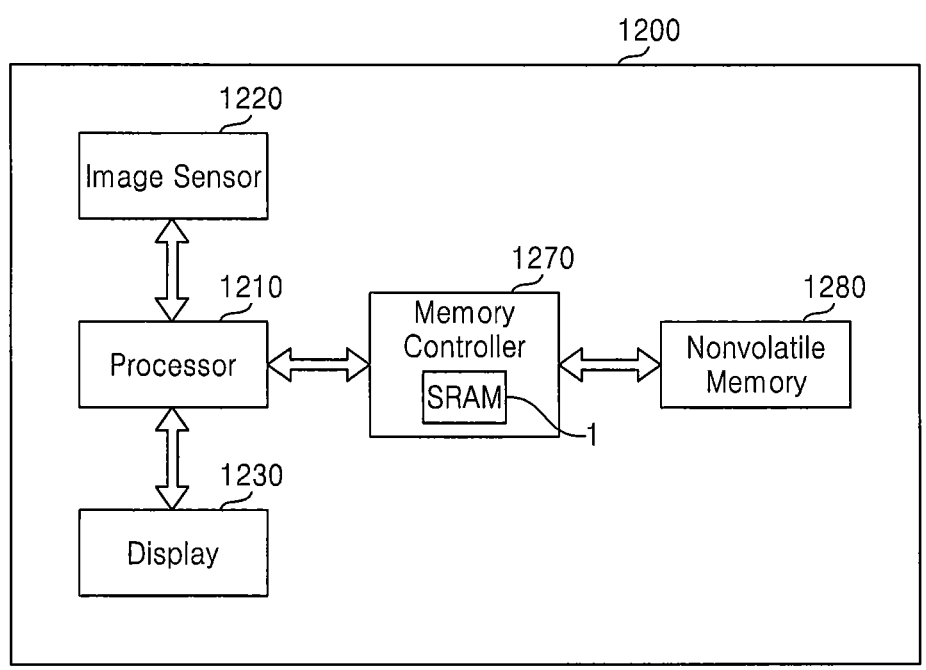
FIG. 12 is a block diagram of a memory system including the semiconductor memory device illustrated in FIG. 1 according to some embodiments of the present inventive concepts.

FIG. 12 is a block diagram of a memory system 1200 including the semiconductor memory device 1 illustrated in FIG. 1 according to some embodiments. The memory system 1200 may be implemented as an image processor like a digital camera, a cellular phone equipped with a digital camera, a smart phone equipped with a digital camera, or a tablet PC equipped with a digital camera.

The memory system 1200 includes a non-volatile memory device 1280 and a memory controller 1270 controlling data processing operations, such as a program operation, an erase operation, and a read operation, of the non-volatile memory device 1280. The memory controller 1270 includes the SRAM 1 for temporarily storing data output from the non-volatile memory device 1280 or data to be output to the nonvolatile memory device 1280.

An image sensor 1220 included in the memory system 1200 converts optical images into digital images and outputs the digital images to a processor 1210 or the memory controller 1270. The digital images may be controlled by the processor 1210 to be displayed through a display 1230 or stored in the non-volatile memory device 1280 through the memory controller 1270.

Data stored in the non-volatile memory device 1280 may be displayed through the display 1230 according to the control of the processor 1210 or the memory controller 1270. The memory controller 1270, which may control the operations of the non-volatile memory device 1280, may be implemented as a part of the processor 1210 or as a separate chip.

Figure 13:
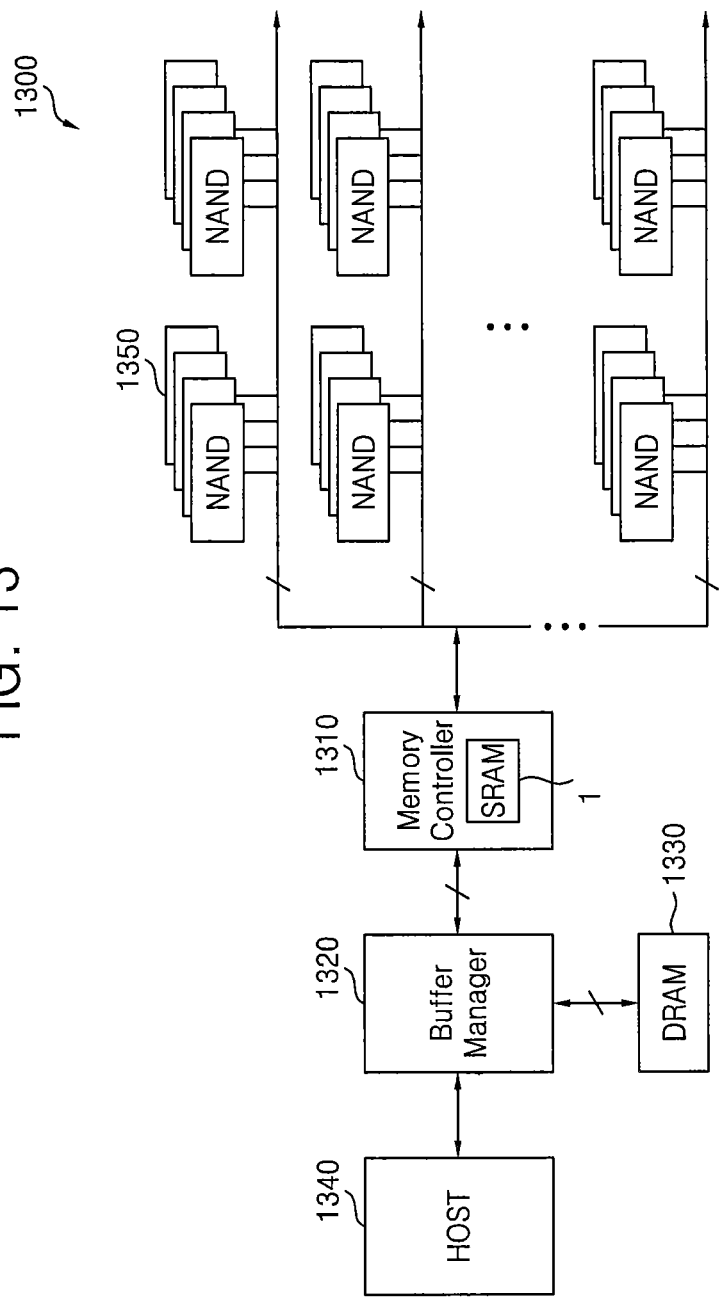
FIG. 13 is a block diagram of a memory system including the semiconductor memory device illustrated in FIG. 1 according to some embodiments of the present inventive concepts.

FIG. 13 is a block diagram of a memory system 1300 including the semiconductor memory device 1 illustrated in FIG. 1 according to some embodiments. The memory system 1300 may be implemented as a data storage system like a solid state drive (SSD).

The memory system 1300 includes a plurality of non-volatile memory devices 1350, a memory controller 1310 controlling data processing operations of the non-volatile memory devices 1350, a dynamic random access memory (DRAM) 1330, and a buffer manager 1320 controlling data transferred between the memory controller 1310 and a host 1340 to be stored in the DRAM 1330.

The memory controller 1310 includes the SRAM 1. The SRAM 1 may temporarily store data output from the non-volatile memory devices 1350 and then transmit the data to the DRAM 1330 according to the control of the buffer manager 1320. The memory controllers 840, 950, 1040, 1110, 1270 and 1310 described according to various embodiments herein may include the SRAM 1 and a microprocessor that controls operations, e.g., a write operation and a read operation, etc., of the SRAM 1.

Figure 14:
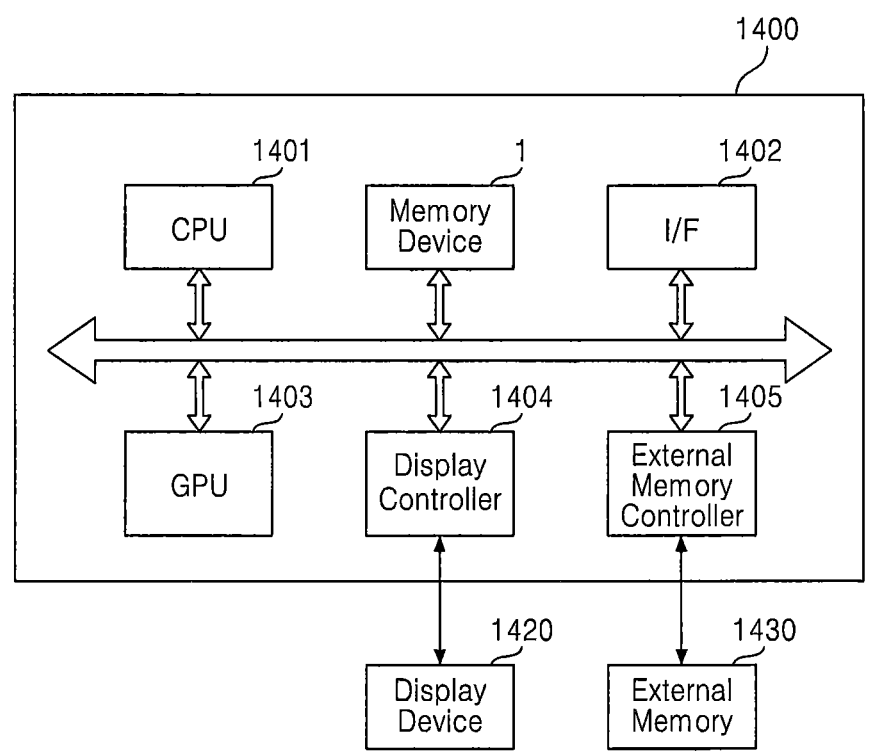
FIG. 14 is a block diagram of a system-on-chip (SoC) including the semiconductor memory device of FIG. 1 according to some embodiments of the present inventive concepts.

FIG. 14 is a block diagram of a system-on-chip (SoC) 1400 including the semiconductor memory device 1 of FIG. 1 according to some embodiments. Referring to FIG. 14, the SoC 1400 may include a CPU 1401, a volatile memory device 1, an interface unit 1402, a graphics processing unit (GPU) 1403, a display controller 1404, and an external memory controller 1405.

The CPU 1401 may be capable of controlling overall operations of the SoC 1400 and may control operations of the volatile memory device 1, the interface (I/F) unit 1402, the GPU 1403, the display controller 1404, and the external memory controller 1405.

The external memory controller 1405 may control a memory operation when data is transmitted to or received from an external memory 1430 connected to the SoC 1400, The GPU 1403 processes data, which is read from the external memory 1430 by the memory controller 1405, to be displayed. The display controller 1404 controls whether the processed signal is to be transmitted to a display device 1420.

A semiconductor memory device according to various embodiments of the present inventive concepts is capable of enabling a pair of bit lines to have stable low-voltage characteristics. Accordingly, a half-selected memory cell may stably retain latch data without being influenced by noise caused by the pair of bit lines.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device comprising:
 a plurality of memory cells in a region in which pairs of bit lines intersect with pairs of word lines; and
 a discharge circuit connected to ones of the memory cells corresponding to one of the pairs of bit lines via the one of the pairs of bit lines,
 wherein the discharge circuit is configured to discharge a bit line or a complementary bit line, of the one of the pairs of bit lines, corresponding to a half-selected memory cell among the ones of the memory cells during a read or write operation of a memory cell selected from among the plurality of memory cells, and wherein the discharge circuit comprises:
- a connector configured to connect the bit line and the complementary bit line corresponding to the half-selected memory cell to the discharge circuit in response to a selection signal;
- a dummy memory cell connected between a dummy word line and the bit line and the complementary bit line, the dummy memory cell configured to discharge the bit line and the complementary bit line; and
- a bit line clamp circuit configured to control a difference between respective voltages of the bit line and the complementary bit line, based on respective levels of data stored in a first latch node and a second latch node of the half-selected memory cell.

2. The semiconductor memory device of claim 1, wherein the dummy memory cell comprises:
- a first pass cell comprising a first input node; and
- a second pass cell comprising a second input node that is separated from the first input node.

3. The semiconductor memory device of claim 1, wherein the dummy word line is configured to be activated simultaneously with a word line corresponding to the selected memory cell.

4. The semiconductor memory device of claim 1, wherein the bit line and the complementary bit line corresponding to the half-selected memory cell are configured to have different respective voltages.

5. The semiconductor memory device of claim 1, wherein the semiconductor memory device comprises a static random access memory (SRAM).

6. The semiconductor memory device of claim 1, wherein:
the device further comprises a control circuit;
the connector is configured to connect the bit line and the complementary bit line connected to the half-selected memory cell to the discharge circuit in response to the selection signal supplied from the control circuit; and
the discharge circuit comprises:
- a bit line control circuit configured to pre-charge or discharge the bit line and the complementary bit line in response to a first control signal and a second control signal supplied from the control circuit.

7. The semiconductor memory device of claim 6,
wherein the bit line clamp circuit is configured to control the difference between the respective voltages of the bit line and the complementary bit line discharged by the bit line control circuit, based on the respective levels of data stored in the first latch node and the second latch node of the half-selected memory cell.

8. The semiconductor memory device of claim 6, wherein the first control signal comprises a pre-charge signal output from the control circuit to pre-charge the bit line and the complementary bit line.

9. A semiconductor memory device comprising:
first and second memory cells, the first memory cell connected to a bit line and a complementary bit line; and
a discharge circuit connected to the first memory cell via the bit line and the complementary bit line, wherein the discharge circuit is configured to discharge the first memory cell during a read or write operation of the second memory cell, and wherein the first and second memory cells comprise half-selected and selected memory cells, respectively, during the read or write operation of the second memory cell, wherein the bit line and the complementary bit line comprise a first bit line and a first complementary bit line, respectively,
wherein the device further comprises a second bit line and a second complementary bit line connected to the second memory cell,
wherein the discharge circuit comprises a first discharge circuit,
wherein the device further comprises a second discharge circuit connected to the second memory cell via the second bit line and the second complementary bit line,
wherein the second discharge circuit is configured to discharge the second memory cell during a read or write operation of the first memory cell,
wherein the first and second discharge circuits comprise first and second dummy memory cells, respectively, configured to discharge a first bit line pair comprising the first bit line and the first complementary bit line and a second bit line pair comprising the second bit line and the second complementary bit line, respectively, and
wherein the first dummy memory cell comprises first and second pass cells connected to the first bit line and the first complementary bit line, respectively.

10. The device of claim 9, wherein the first discharge circuit further comprises a bit line clamp circuit comprising first and second transistors configured to control a difference between respective voltages of the first bit line and the first complementary bit line.

11. A semiconductor memory device comprising:
first and second memory cells connected to a first bit line pair comprising a first bit line and a first complementary bit line, and a second bit line pair comprising a second bit line and a second complementary bit line, respectively; and
first and second discharge circuits connected to the first and second memory cells via the first and second bit line pairs, respectively, wherein the first discharge circuit is configured to discharge the first memory cell during a read or write operation of the second memory cell, wherein the first and second memory cells comprise half-selected and selected memory cells, respectively, during the read or write operation of the second memory cell, wherein the second discharge circuit is configured to discharge the second memory cell during a read or write operation of the first memory cell, and wherein the first and second memory cells comprise selected and half-selected memory cells, respectively, during the read or write operation of the first memory cell, wherein:
the first and second discharge circuits comprise first and second dummy memory cells, respectively, configured to discharge the first and second bit line pairs, respectively;
the first dummy memory cell comprises first and second pass cells connected to the first bit line and the first complementary bit line, respectively; and
the first discharge circuit further comprises a bit line clamp circuit comprising first and second transistors configured to control a difference between respective voltages of the first bit line and the first complementary bit line.

12. The semiconductor memory device of claim 1,
wherein the bit line and the complementary bit line comprise a first bit line and a first complementary bit line, respectively,
wherein the device further comprises a second bit line and a second complementary bit line,
wherein the discharge circuit comprises a first discharge circuit, and wherein the device further comprises a second discharge circuit configured to discharge the second bit line and the second complementary bit line.

13. The semiconductor memory device of claim 12,
wherein the bit line clamp circuit comprises a first bit line clamp circuit comprising first and second transistors configured to control the difference between the respective voltages of the first bit line and the first complementary bit line, and
wherein the second discharge circuit further comprises a second bit line clamp circuit comprising third and fourth transistors configured to control a difference between respective voltages of the second bit line and the second complementary bit line.

14. The semiconductor memory device of claim 12,
wherein the dummy memory cell comprises a first dummy memory cell,
wherein the device further comprises a second dummy memory cell, and
wherein the first and second discharge circuits comprise the first and second dummy memory cells, respectively.

15. The semiconductor memory device of claim 10,
wherein the second discharge circuit further comprises a second bit line clamp circuit comprising third and fourth transistors configured to control a difference between respective voltages of the second bit line and the second complementary bit line.

16. The semiconductor memory device of claim 9, wherein:
the device further comprises a control circuit; and
the first discharge circuit comprises:
a connector configured to connect the first bit line and the first complementary bit line connected to the half-selected memory cell to the first discharge circuit in response to a selection signal supplied from the control circuit; and
a bit line control circuit configured to pre-charge or discharge the first bit line and the first complementary bit line in response to a first control signal and a second control signal supplied from the control circuit.

17. The semiconductor memory device of claim 16,
wherein the first discharge circuit further comprises a bit line clamp circuit configured to control a difference between respective voltages of the first bit line and the first complementary bit line discharged by the bit line control circuit, based on respective levels of data stored in a first latch node and a second latch node of the half-selected memory cell.

18. The semiconductor memory device of claim 11,
wherein the bit line clamp circuit comprises a first bit line clamp circuit, and
wherein the second discharge circuit further comprises a second bit line clamp circuit comprising third and fourth transistors configured to control a difference between respective voltages of the second bit line and the second complementary bit line.

19. The semiconductor memory device of claim 11, wherein:
the device further comprises a control circuit; and
the first discharge circuit comprises:
a connector configured to connect the first bit line and the first complementary bit line connected to the half-selected memory cell to the first discharge circuit in response to a selection signal supplied from the control circuit; and
a bit line control circuit configured to pre-charge or discharge the first bit line and the first complementary bit line in response to a first control signal and a second control signal supplied from the control circuit.

20. The semiconductor memory device of claim 19,
wherein the bit line clamp circuit is configured to control the difference between the respective voltages of the first bit line and the first complementary bit line discharged by the bit line control circuit, based on the respective levels of data stored in a first latch node and a second latch node of the half-selected memory cell.

* * * * *